United States Patent
Hoffmann et al.

(10) Patent No.: US 7,365,659 B1
(45) Date of Patent: Apr. 29, 2008

(54) METHOD OF CONTEXT ADAPTIVE BINARY ARITHMETIC CODING AND CODING APPARATUS USING THE SAME

(75) Inventors: Nils Hoffmann, Hamburg (DE); Rainer Theuer, Sehnde (DE)

(73) Assignee: Silicon Image GmbH, Hannover (DE)

( * ) Notice: Subject to any disclaimer, the term of this patent is extended or adjusted under 35 U.S.C. 154(b) by 0 days.

(21) Appl. No.: 11/567,514

(22) Filed: Dec. 6, 2006

(51) Int. Cl.
*H03M 7/00* (2006.01)

(52) U.S. Cl. .................. 341/107; 341/50; 341/51; 341/106; 382/244; 382/245; 382/246; 382/247

(58) Field of Classification Search ............... 341/107; 382/247
See application file for complete search history.

(56) References Cited

U.S. PATENT DOCUMENTS

| | | | | |
|---|---|---|---|---|
| 4,862,167 A | * | 8/1989 | Copeland, III | 341/107 |
| 5,886,655 A | * | 3/1999 | Rust | 341/107 |
| 6,538,583 B1 | * | 3/2003 | Hallmark et al. | 341/51 |
| 7,095,344 B2 | * | 8/2006 | Sekiguchi et al. | 341/107 |
| 7,286,710 B2 | * | 10/2007 | Marpe et al. | 382/239 |
| 2007/0030180 A1 | * | 2/2007 | Yang et al. | 341/50 |

* cited by examiner

*Primary Examiner*—Khai M. Nguyen
(74) *Attorney, Agent, or Firm*—Witham Curtis Christofferson & Cook, PC

(57) ABSTRACT

A method of context adaptive binary arithmetic coding (CABAC) of a sequence of data slices permits for quick initialization of context models. The data slices include a plurality of binarized symbols with context individual values having one or more bins of the binarized symbol. The method includes resetting an addressable status register for each new data slice where the status register includes status flag for one of a plurality of available context variable values. Context models are selected for each of a plurality of context individual values and are coded according to a selected context model. A selected context model is updated for an actual context index value based on the previous context index value.

13 Claims, 2 Drawing Sheets

METHOD OF CONTEXT ADAPTIVE BINARY ARITHMETIC CODING AND CODING APPARATUS USING THE SAME

BACKGROUND OF THE INVENTION

1. Field of the Invention

The present invention relates to context adaptive binary arithmetic coding (CABAC) and more particularly, to a method which can quickly initialize context models for a new data slice in the process of context adaptive binary arithmetic coding, and a coding apparatus using the same.

2. Description of the Related Art

Compression coding is required for storing or transmitting data, especially of a video sequence, which is composed of images. A standard for encoding and decoding of video data is established as H.264, which is also known as MPEG4, part 10, "Advanced Video Coding". The standard specifies two types of entropy coding, namely context-based adaptive binary arithmetic coding (CABAC) and variable-length coding (VLC).

In the H.264 process, an image is split in macro blocks. A macro block comprises a 16×16 pixels luminance block and two 8×8 pixels chrominance blocks. A slice is a collection of macro blocks belonging to a single image. The H.264 bit stream is structured in NAL units, each NAL unit contains the information of one slice.

H.264 optionally uses context adaptive binary arithmetic coding to further compress data that has already been compressed using spatial and temporal prediction, transforms, quantization and other techniques.

CABAC coding does not result in the loss of information, but may result in considerable compression gains. A syntax element, which typically represents a coefficient or other datum from prior compression is further encoded as a variable length sequence of binary bits ("bins"), and the individual bins are there encoded using arithmetic coding. A bin is typically a two-valued symbol. A sequence of symbols is expressed as a single fractional binary number between 0 and 1 using recursive subdivision of intervals to encode successive symbols. The number has as many fractional bits of precision as are needed to express its value. The relative likelihood of occurrence of a 1 and a 0 is used to encode the bin with statistically optimal efficiency. A dynamic context table is kept with likelihood entries for each of many different types of bins within syntax elements in the decoder. The context table is initialized at the beginning of a new slice of video data.

Thus, context-based adaptive binary arithmetic coding (CABAC) achieves good compression performance through selecting probability models for each syntax element according to the element's context and adapting probability estimates based on local statistics and using arithmetic coding. Coding a data symbol involves the stages of a) binarization, wherein a non-binary-valued symbol, e.g. a transform coefficient or motion vector, is binarized or converted into a binary code prior to arithmetic coding;

and for each bit or bin of the binarized symbol:

b) context model selection, wherein a context model is a probability model for one or more bins of the binarized symbol, which had been chosen from a selection of available models depending on the statistics of recently-coded data symbols. The context model stores the probability of each bin beam "1" or "0";

c) arithmetic encoding, wherein an arithmetic coder encodes each bin according to the selected probability model; and d) probability update, wherein the selected context model is updated based on the actual coded value, e.g. if the bin value was "1", the frequency count for the "1"-bins is increased.

The context models and binarization schemes for each syntax element are defined in the H.264- and MPEG-4-standard. There are a total of 267 separate context models for the various syntax elements. Some models have different uses depending on the slice type. For example, skipped macro blocks are not permitted in an I-slice and so context models 0 to 2 are used to code bins of macro block-skip or macro block-type depending on whether the current slice is Intra coded.

At the beginning of each coded slice, the context models are initialized depending on the initial value of the sequentialization parameter, since it has a significant effect on the probability of occurrence of the various data symbols.

US 2004/0260739 A1 discloses a system and apparatus for accelerating arithmetic decoding of encoded data wherein a stream of intermediate binary symbols is generated from the context adaptive binary arithmetic coded data at the channel rate. The stream of intermediate binary symbols is then decoded at a consumption rate. Context table values are developed from the previous bins processed in the arithmetic decoder and stored in a context RAM.

US 2006/0017592 A1 discloses a method of context adaptive binary arithmetic coding comprising and generating a plurality of syntax elements of residual blocks, grouping flags of the plurality of syntax elements and coding the grouped flags. Thus, coding is performed for the group flags rather than on the syntax elements.

FIG. 1 is a block diagram of a conventional part of a CABAC coding apparatus including the unit required for initialization computation within advanced cycles. As a regulation for the computation of the initial context variable value is given by the initialization arisen in the H.264 standard as follows:

1. preCtxState=Clip3 (1,126, ((m×Clip3 (0,51, Slice QPy))>>4)+n)
2. if (preCtxState<=63) {
   pstateIdx=63−preCtxState
   valMps=0
   } else {
   pStateIdx=preCtxState−64
   valMps=1
   }
   Context Variable={paStateIdx, valMps}

$$\text{Clip } 3(x, y, z) = \begin{cases} x; z_1 \\ y; z > y \\ z; \text{otherwise} \end{cases}$$

This initialization algorithm is to be accomplished for all n context variables with each new frame. In case of n=460, a conventional procedure of 460 clock cycles are needed, to initialize all of 460 context variables, before starting this decoding and/or encoding.

In the conventional CABAC apparatus, the context index value is fed via a multiplexer to a context memory together with a new initialized context variable or a new context variable value. In case of the counter starting for each new slice from 0 to n (e.g. n=460) the multiplexer for the context index is set to 0 and the multiplexer for the context variable is also set to 0. The initializing cycle is finished after the index count reached n, so that the multiplexers are switched to "1" in order to update the context table entries with the new context variable in relation to the actual context index.

The decoder and/or encoder is connected to the output of the context memory.

The index counter is reset to 0 for each new slice and controls a table for all available n context variables and corresponding values m used for the initializing algorithm in step a).

The n,m table is used for the initializing algorithm, which is provided for computation of the initial context variable value, which is stored in the context memory induced in the following coding process.

As a lead time of n clock cycles, n being the amount of available context variables, causes bottle-neck situation in the entire CABAC procedure.

SUMMARY OF THE INVENTION

Additional aspects and/or advantages of the invention will be set forth in part in the description which follows and, in part, will be apparent from the description, or may be learned by the practice of the invention.

The present invention provides a method and a coding apparatus in which no lead time is required for initialization computation of all context variables.

According to an aspect of the present invention, there is provided a method of context adaptive binary arithmetic coding of a sequence of data slices. The data slices are comprised of a plurality of binarized symbols including context index values that are comprised of one or more bins of the binarized symbol. The method is comprised of several steps. In one step, an addressable status register is reset for each new data slice, which is to be coded. The status register comprises a status flag for each of a plurality of available context variable values indicating whether a related context variable value is already initialized by storing the context variable value related to the variable index value in a context table or not, so that at the beginning of the process of coding a new data slice a related context model is indicated as fully not initialized. In another step, checking the status of a context index value in the status register is performed. If the context variable value addressed by the context index value is indicated as not to be initialized, then the additional steps of initializing of a context model for the context index value, and otherwise reading the initialized context variable value for the context index value out of the context table, are preformed. In yet another step, a context model is selected for each of the plurality of context index values. In still yet another step, arithmetic coding of each context index value according to the selected context model is performed. In still yet another step, the selected context model is updated for an actual context index value based on the previous context index value.

According to another aspect of the present invention there is provided a method of context adaptive binary arithmetic coding of a sequence of data slices. The data slices are comprised of a plurality of binarized symbols including context index values comprising one or more bins of the binarized symbol. The method is comprised of several steps. In one step, an addressable status register is reset for each new data slice, which is to be coded. The status register comprises a status flag for each of a plurality of available context variable values indicating whether a related context variable value is already initialized by storing the context variable value related to the variable index value in a context table or not, so that at the beginning of the process of coding a new data slice a related context model is indicated as fully not initialized. In another step, checking in the status register is performed, if the context variable value addressed by the actual context index value is initialized. If the context variable value is initialized, then the selected context variable value of the context table entry, which is related to the actual context index value, is used for the coding process; and in case that the context variable value addressed by the context index value is indicated as not to be initialized. In yet another step, initializing of a context module for the context index value is performed by processing a context variable value for the actual context index value installing the context variable value related to the actual variable index value in a context table. In still yet another step, arithmetic coding of the actual context index value is performed by use of a related context variable value, which is taken from the context table entry or obtained by the step of initializing of context model for the context index value. In still yet another step, storing the previous context variable value used in the arithmetic coding step of an actual context index value in a context variable value register. In still yet another step, comparing the following context index value and the previous context variable value stored in the context variable value register. In case of a context variable value match, then still yet another step of using the stored previous context variable value for the subsequent step of arithmetic coding of the current context index value. In case that the context index value differs from each other, then still yet another step of checking the status of a current context index value in the status register. In case that the context index value is indicated as not to be initialized, then still yet another step of initializing of a context model for the current context index value and using the initialized context model including a context variable value for the following step of arithmetic coding of the current context index value. In case that the context index value is indicated as initialized, then still yet another step of reading the context variable value related to the current context index value out of the context table and using said context variable value for the following step of arithmetic coding of the current context index value.

According to still another aspect of the present invention, there is provided a coding apparatus for context adaptive binary arithmetic coding of a sequence of data slices, said data slices comprising a plurality of binarized symbols including context index values comprising one or more bins of the binarized symbol. The apparatus is comprised of a coding unit provided for arithmetic coding of each context index value according to a selected context model. The apparatus us further comprised of a context memory provided for storing a plurality of context models including a context table for assigning a plurality of context variable values to related context index values. The apparatus us further comprised of an addressable status register provided for storing of a status flag for each of a plurality of available context index values, said status flag indicating whether a related context index value is already initialized by storing the context variable value related to the variable index value in a context table. The apparatus us further comprised of an initializing unit for initializing of a context model for a current context index value by processing a context variable value related to the current variable index value and storing the context variable value in relation to the variable index value in a context table. The apparatus us further comprised of a control unit provided for checking the status of a context index value in the status register and in case that the context index value is indicated as not to be initialized, initializing of a context model for the context index value by means of the initializing unit, and in case that the context index value is indicated as initialized, reading the context variable value related to the current context index value out of the context table in the context memory.

According to still another aspect of the present invention, there is provided a method comprising the further steps of storing the previous context variable value in a context variable value register and comparing the current context index value and the previous context index value and using the stored previous context variable value for the coding process in case of a context variable value match point in order to prevent latencies, which result from context memory accesses.

BRIEF DESCRIPTION OF THE DRAWINGS

These and/or other aspects and advantages of the invention will become apparent more readily appreciated from the following description of the embodiments, taken in conjunction with the accompanying drawings of which.

DETAILED DESCRIPTION OF PREFERRED EMBODIMENT

In the following description, reference is made to the accompanying drawings, which form a part hereof and which is shown by way of illustration said embodiments of the present invention. It is understood that other embodiments may be utilized. Any structural changes may be made without departing from the scope of the present invention.

Figure 1:
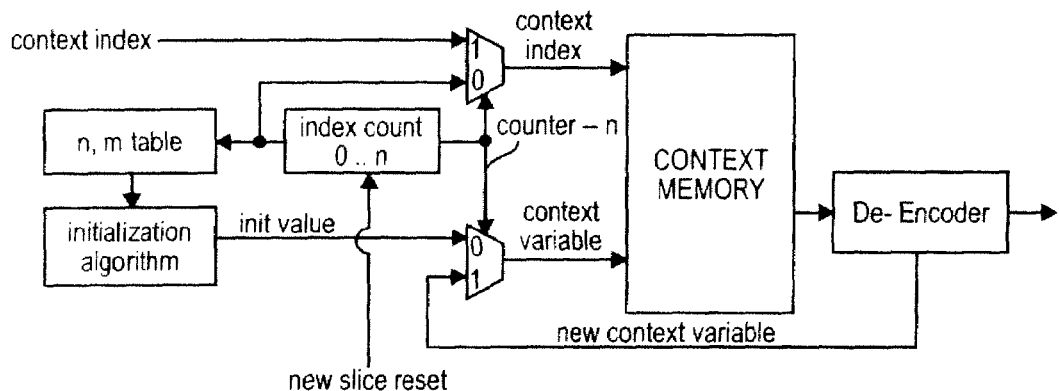
FIG. 1 is a block diagram of a conventional context adaptive binary arithmetic coding (CABAC) apparatus.
Figure 2:
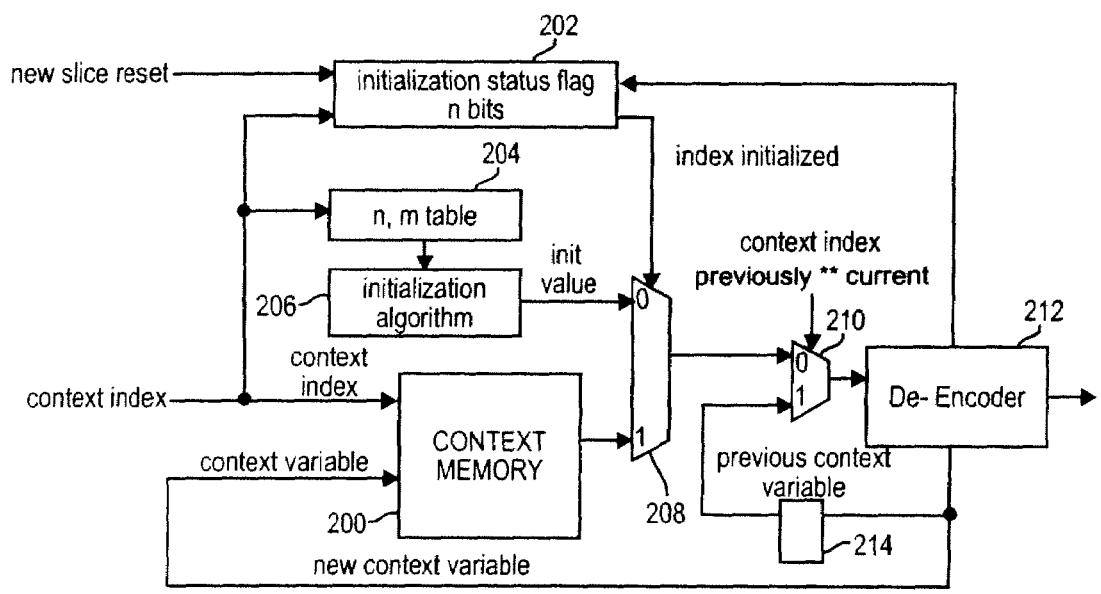
FIG. 2 is a block diagram of a context adaptive binary arithmetic coding (CABAC) apparatus according to an embodiment of the present invention.

FIG. 2 is a block diagram of a context adaptive binary arithmetic coding (CABAC) apparatus according to an embodiment of the present invention. A sequence of context index values of a slice are fed into a context memory 200, a status flag register 202 and a (m,m)-table 204. The CABAC coder further comprises a reset command for the status flag register 202 if coding a new slice. Then, the reset of each status flag in the status register 202 for each of a plurality of available context index values is performed, so that at the beginning of the process of coding a new data slice, a related context model is indicated as not fully initialized.

Initializing of context index values in related context variable values is performed in an initializing unit 206 for initializing a context model for a current context index value. The initialized context variable value is led via a first multiplexer 208 to a second multiplexer 210. If the previous context index value is not identical to the current context index value, the initialized context variable value is led through the second multiplexer 210 to a coding unit 212 provided for arithmetic coding of each context index value according to a selected context model, i.e. the current context variable value related to the context index value.

The previous context variable value used of the coding unit 212 is further stored in a context variable value register 214 and used for the following coding process in a case that the previous context index value matches to the current context index value. Then, the second multiplexer 210 is set to "1".

In case that the current context index value is indicated as being initialized in the status register 210, the first multiplexer 208 is set to "1" and the initialized context variable value for the current context index value is read out of the context memory 200.

Further, in order to initialize context index values, a new context variable value processed in the coding unit 212 for a current context index value is stored in the context memory 200 in relation to the context index value.

In order to read out the context variable values and the status flag of the context index values, the status register 202 and the context memory 200 are preferably addressed by the context index value.

The advance free initialization is therefore realized with the help of the new status flag register 202, which has a depth of n bits, in accordance with the amount of the different context variables which need to be stored. The status register 202 will always be reset before de- and/or encoding a new slice. The reset corresponds to the status "all n context variables are not initialized". If one of the context variables which will be addressed by the context index is not initialized, the result of the initialization computation will be used.

A variable characterized as initialized will be taken directly out of the context memory 200, if it does not possess the same context index as the previous context variable.

To prevent latencies, which result from memory accesses, the context variable value register 214 is provided which stores the previous context variable value. If the current context index and the previous context index are identical, the previous context variable which is stored in the context variable value register 214 will be used for the de- and/or encoding procedure.

Figure 3:
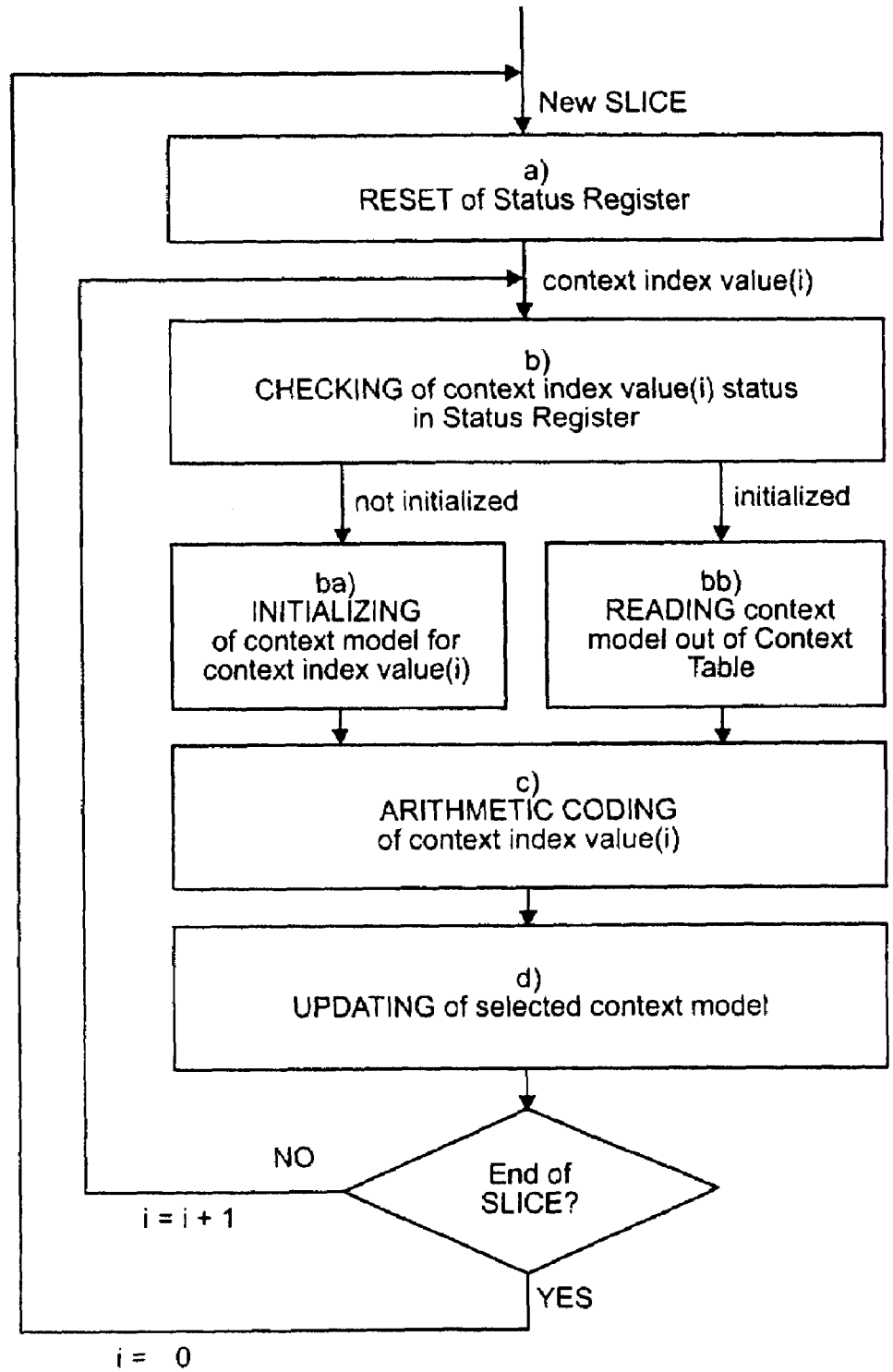
FIG. 3 is a flow chart illustrating a CABAC method according to an embodiment of the present invention.

The method of context adaptive binary arithmetic coding of a sequence of data slices according to one embodiment of the present invention is further explained in more detail in FIG. 3. FIG. 3 shows a flow chart presenting an overview of the processed steps used to practise the embodiment of the present invention.

For each new slice, reset of the status register 202 is performed in step a). The status register 202 comprises a plurality of status flag, where each available context variable value is provided with a corresponding status flag. The status flag indicates, whether a related context variable value is already initialized by storing the context variable value related to the variable index value in a context table stored in the context memory 200 or not. After step a) at the beginning of the process of coding a new data slice, a related context model is indicated as fully not initialized.

Then, for each context index value (i) of a sequence of 0 to p context index values of a slice, the step b) is performed of checking of the status of the current context index value (i) in the status register 202.

If the context variable value addressed by the current context index value is indicated as not to be initialized, in step ba) a context model for the current context index value (i) is initialized. The process of initializing is defined in the H.264 standard and explained in the introductory portion of the present application in detail, so that no further explanation of this well known technique is required.

If the context variable value addressed by the context index value is indicated as initialized, in step bb), the context model for the current context index value (i) is read out of the context table stored in the context memory 200.

The context model comprising the context variable value related to the current context index value is then used for the step c) of arithmetic coding of the current context index value (i). The procedure of decoding and/or encoding of current context index value (i) by use of the respective context model is well-known in the prior art and needs no further explanation.

Then, in step d), the selected context model is updated. In case that an update is required, the new context variable value is written into the context memory 200 in respect to the current context index value.

The steps b) to d) are repeated for each context index value (i) of a slice. Therefore, the index (i) is increased.

If the end of a slice is reached, the index (i) is set to 0 and the method starts at step a) of resetting the status register 202 for the next following new slice.

The invention claimed is:

1. Method of context adaptive binary arithmetic coding of a sequence of data slices, said data slices comprising a plurality of binarized symbols including context index values comprising one or more bins of the binarized symbol, said method comprising the steps of:
   a) Resetting an addressable status register for each new data slice, which is to be coded, said status register comprising a status flag for each of a plurality of available context variable values indicating whether a related context variable value is already initialized by storing the context variable value related to the variable index value in a context table or not, so that at the beginning of the process of coding a new data slice a related context model is indicated as fully not initialized;
   b) Checking the status of a context index value in the status register, and in case that the context variable value addressed by the context index value is indicated as not to be initialized:
      ba) initializing of a context model for the context index value, and otherwise
      bb) reading the initialized context variable value for the context index value out of the context table;
   c) Selecting a context model for each of the plurality of context index values;
   d) Arithmetic coding of each context index value according to the selected context model; and
   e) Updating the selected context model for an actual context index value based on the previous context index value.

2. Method of claim 1, comprising the further steps of:
   e) Storing the previous context variable value in a context variable value register,
   f) Comparing the current context index value and the previous context index value, and
   g) Using the stored previous context variable value for the coding process in case of a context variable value match.

3. Method of claim 1, comprising the further steps of:
   e) Storing the previous context variable value in a context variable value register,
   f) Comparing the current context index value and the previous context index value, and in case that the context index values differ from each other,
   g) Checking in the status register, if the context variable value addressed by the actual context index value is initialized, and in case that the context variable value is initialized
   h) Using the selected context variable value of the context table entry, which is related to the actual context index value, for the coding process.

4. Method of claim 1, characterized in that the process of coding of context index values include the process of decoding.

5. Method of claim 1, characterized in that the process of coding of context index values includes the process of encoding.

6. Method of claim 1, characterized in that the process of coding of context index values includes the process of decoding and encoding.

7. Method of context adaptive binary arithmetic coding of a sequence of data slices, said data slices comprising a plurality of binarized symbols including context index values comprising one or more bins of the binarized symbol, said method comprising the steps of:
   a) Resetting an addressable status register for each new data slice, which is to be coded, said status register comprising a status flag for each of a plurality of available context variable values indicating whether a related context variable value is already initialized by storing the context variable value related to the variable index value in a context table or not, so that at the beginning of the process of coding a new data slice a related context model is indicated as fully not initialized;
   b) Checking in the status register, if the context variable value addressed by the actual context index value is initialized, and in case that the context variable value is initialized, using the selected context variable value of the context table entry, which is related to the actual context index value, for the coding process; and in case that the context variable value addressed by the context index value is indicated as not to be initialized;
   c) Initializing of a context module for the context index value by processing a context variable value for the actual context index value installing the context variable value related to the actual variable index value in a context table;
   d) Arithmetic coding of the actual context index value by use of a related context variable value, which is taken from the context table entry or obtained by the step of initializing of context model for the context index value;
   e) Storing the previous context variable value used in step d) of arithmetic coding of an actual context index value in a context variable value register;
   f) Comparing the following context index value and the previous context variable value stored in the context variable value register and in case of a context variable value match,
   g) Using the stored previous context variable value for the subsequent step d) of arithmetic coding of the current context index value, and in case that the context index value differs from each other,
   h) Checking the status of a current context index value in the status register; and in case that the context index value is indicated as not to be initialized,
      initializing of a context model for the current context index value and using the initialized context model including a context variable value for the following step of arithmetic coding of the current context index value, and in case that the context index value is indicated as initialized,
      reading the context variable value related to the current context index value out of the context table and using said context variable value for the following step of arithmetic coding of the current context index value.

8. Method of claim 7, characterized in that the process of coding of context index values includes the process of decoding.

9. Method of claim 7, characterized in that the process of coding of context index values includes the process of encoding.

10. Method of claim 7, characterized in that the process of coding of context index values includes the process of decoding and encoding.

11. Coding apparatus for context adaptive binary arithmetic coding of a sequence of data slices, said data slices comprising a plurality of binarized symbols including context index values comprising one or more bins of the binarized symbol, said apparatus comprising:
- a coding unit provided for arithmetic coding of each context index value according to a selected context model;
- a context memory provided for storing a plurality of context models including a context table for assigning a plurality of context variable values to related context index values;
- an addressable status register provided for storing of a status flag for each of a plurality of available context index values, said status flag indicating whether a related context index value is already initialized by storing the context variable value related to the variable index value in a context table;
- an initializing unit for initializing of a context model for a current context index value by processing a context variable value related to the current variable index value and storing the context variable value in relation to the variable index value in a context table; and
- a control unit provided for checking the status of a context index value in the status register and in case that the context index value is indicated as not to be initialized, initializing of a context model for the context index value by means of the initializing unit, and in case that the context index value is indicated as initialized, reading the context variable value related to the current context index value out of the context table in the context memory.

12. Coding apparatus of claim 11, further comprising
- a context variable value register provided for storing a previous context variable value; and
- a selection unit for selecting either the previous context various variable value stored in the context variable value register in case that the actual current context variable value corresponds to the stored previous context variable value or otherwise selecting a context variable value obtained from the context memory or from the initializing unit.

13. Coding apparatus of claim 11, wherein the coding unit is connected to the context memory and the status register and provided to write a new initialized variable into the context memory and in relation to a related context index value and to set the status flag of the related context index to indicate that the context index value is initialized.

* * * * *